United States Patent [19]
Sanville, Jr. et al.

[11] Patent Number: 5,670,250
[45] Date of Patent: Sep. 23, 1997

[54] CIRCUIT BOARD PREPREG WITH REDUCED DIELECTRIC CONSTANT

[75] Inventors: Robert J. Sanville, Jr., Northfield; Carl P. Kernander, Lee, both of N.H.

[73] Assignee: Polyclad Laminates, Inc., West Franklin, N.H.

[21] Appl. No.: 442,119

[22] Filed: May 16, 1995

Related U.S. Application Data

[63] Continuation of Ser. No. 406,039, Mar. 16, 1995, abandoned, which is a continuation of Ser. No. 395,496, Feb. 24, 1995, abandoned.

[51] Int. Cl.$^6$ .................... B32B 5/16; B32B 9/00; D02G 3/00; H05K 1/09
[52] U.S. Cl. .............. 428/323; 428/320.2; 428/375; 428/391; 428/340; 428/446; 428/447; 428/209; 428/901; 174/256
[58] Field of Search ............... 428/323, 209, 428/446, 447, 402, 320.2, 340, 395, 391; 174/256

[56] References Cited

U.S. PATENT DOCUMENTS

| | | | |
|---|---|---|---|
| 3,700,538 | 10/1972 | Kennedy | 161/93 |
| 4,134,848 | 1/1979 | Adicoff et al. | 252/63.2 |
| 4,238,641 | 12/1980 | Planting et al. | 174/88 C |
| 4,241,132 | 12/1980 | Pratt et al. | 428/285 |
| 4,268,337 | 5/1981 | Ibata et al. | 156/244.17 |
| 4,309,334 | 1/1982 | Valitsky | 260/42.15 |
| 4,335,180 | 6/1982 | Traut et al. | 428/303 |
| 4,405,543 | 9/1983 | Murphy et al. | 264/123 |
| 4,447,565 | 5/1984 | Lula et al. | 523/219 |
| 4,610,495 | 9/1986 | Landi | 339/75 MP |
| 4,640,866 | 2/1987 | Suzuki | 428/422 |
| 4,657,809 | 4/1987 | Eskind | 428/304.4 |
| 4,661,301 | 4/1987 | Okada et al. | 264/41 |
| 4,680,220 | 7/1987 | Johnson | 428/241 |
| 4,788,230 | 11/1988 | Mudge | 523/219 |
| 5,126,192 | 6/1992 | Chellis et al. | 428/323 |

FOREIGN PATENT DOCUMENTS

| | | |
|---|---|---|
| 0279769 | 2/1987 | European Pat. Off. |
| 0 570094 A3 | 11/1993 | European Pat. Off. |
| 2195269 | 5/1987 | United Kingdom |

OTHER PUBLICATIONS

*Principles of Electronic Packaging*, pp. 340–345, Donald P. Seraphim, Ed., 1989.

Hawley's Condensed Chemical Dictionary, 11th Ed., p. 1001 and p. 965 (1987).

IBM Technical Disclosure Bulletin, vol. 31, No. 7, Dec. 1988 "Fabrication Of Printed Circuit Wiring Boards Using Insulation Layers With Low Dielectric Constant" by Chandrashekhar et al., pp. 25–56.

IBM Technical Disclosure Bulletin, vol. 22, No. 5, Oct. 1979 "Low Dielectric Constant Material For Printed Circuit Boards" by Haining et al.

*Handbook of Fillers for Plastics*, published by Van Nostrand Reinhold Company, New York, 1988, edited by Katz and Milewski, pp. 437–452.

IBM Corporate Specification, Flammability Test Methods, Materials and Components/Assemblies, May 1974.

(List continued on next page.)

*Primary Examiner*—Cathy F. Lam
*Attorney, Agent, or Firm*—Blodgett & Blodgett, P.C.

[57] ABSTRACT

This invention involves a prepreg composition and procedure for use in forming printed circuit boards with reduced and uniform dielectric constant, improved thermal expansion characteristics, and uniform appearance. The prepreg composite is a resin impregnated substrate and has a reduced dielectric constant as low as 3.5. It contains 5–30% by resin volume of hollow inorganic microsphere filler whose diameters are less than 40 micrometers, and the uniform distribution of the hollow inorganic microspheres is controlled by the presence of hydrophobic fumed silica or other similar flow modifier.

20 Claims, 4 Drawing Sheets

OTHER PUBLICATIONS

IBM Internal Document "Characterization and Non–Destructive Testing of Thin Dielectrics" as cited in File Wrapper History of U.S. Pat. No. 5,126,192.

IPC Test Methods Manual (IPC–TMM–650) entitled: Glass Transition Temperature Dec. 1987.

IPC Test Methods Manual (IPC–TMM–650) entitled: Peel Strength, Flexible Printed Wiring Materials Jul. 1985.

IPC Test Methods Manual (IPC–TMM–650) entitled: Inner Layer Bond Strength of Multilayer Printed Circuit Boards Oct. 1987.

IPC Test Methods Manual (IPC–TMM–650) entitled: Coefficient of Linear Thermal Expansion of Electrical Insulating Materials Mar. 1986.

IPC Test Methods Manual (IPC–TMM–650) entitled: Dielectric Constant and Dissipation Factor of Printed Wiring Board Material—Chip Method Dec. 1987.

IPC Test Methods Manual (IPC–TMM–650) entitled: Dielectric Withstanding Voltage, Printed Wiring Material Dec. 1987.

IPC Test Methods Manual (IPC–TMM–650) entitled: Pressure Vessel Method for Glass Epoxy Laminate Integrity Jul. 1985.

CIRCUIT BOARD PREPREG WITH REDUCED DIELECTRIC CONSTANT

This application is a continuing application of U.S. Ser. No. 08/406,039, filed Mar. 16, 1995, now abandoned, which is a continuing application of U.S. Ser. No. 08/395,496, filed Feb. 24, 1995, now abandoned.

FIELD OF THE INVENTION

This invention involves a prepreg composition and procedure for use in forming printed circuit boards with reduced and uniform dielectric constant, improved thermal expansion characteristics, and uniform appearance.

BACKGROUND OF THE INVENTION

This invention provides a composition and procedure for producing and utilizing low dielectric constant structures for the electronics industry. Specifically, it employs materials pertaining to a printed wire board matrix (PWB matrix) which may include conductive layers usually connected electrically by copper (such paths are called through holes). This material makes an excellent substrate for surface mounted components (including but not limited to capacitors, inductors, resistors, LED's, etc.).

As the need for faster electronic devices grows, the requirement for low dielectric constant substrate materials grows proportionally. This is due to the fact that signal speed, S, is given by the equation: $S=c/(Dk)^{1/2}$, where Dk is the dielectric constant of the media, and c is the speed of light in a vacuum (or roughly $3\times10^8$ meters/second). Hence, the time delay, T, of a signal transmission is: $T=(Dk)^{1/2}[1/c]$ where l is the length of the path signal. Therefore, in order to produce computers with shorter time delays, one must reduce l by moving components closer together on a given PWB and/or reduce the dielectric constant of said board.

Many of today's PWBs consist of roughly 50% by weight epoxy and 50% by weight electronics grade fiber glass (E-glass). The glass is impregnated by the resin to produce a relatively rigid laminate. Epoxies typically have dielectric constants around 4; E-glass's is roughly 6. To determine the dielectric constant of the composite laminate it is convenient to use the Lichtenecker equation, $1 \text{ n } Dkc = Ve \text{ lnDke} + Vg \text{ lnDkg}$ where Dkc is the composite dielectric constant of the epoxy, Dkg is the dielectric constant of the E-glass, Ve and Vg are the fraction by volume of the epoxy and glass respectively which make up the laminate. Given that the epoxy resin and the E-glass have specific gravities of 1.2 and 2.5 respectively, the 50% by weight example given above yields a composite dielectric constant of $1 \text{ n } Dkc=0.681 \text{ n } (4) +0.321 \text{ n } (6)$ implying a Dk of 4.9. Such a dielectric constant is not sufficiently low to satisfy the demands of the most sophisticated computers now being developed because the resulting time delay is too long.

Many of the other possible materials for producing relatively lower dielectric constant substrates are problematic. Attempts to use low moisture absorbing silicones achieve mixed results: while the desired low Dk is realized, substrate adhesion is poor and the material burns easily. This makes it impossible to obtain an Underwriter's Laboratory 94-VO (UL 94-VO) flammability rating. For safety reasons, few companies are willing to purchase PWB substrates that do not meet UL 94-VO minimum standards. Putting additional flame retardant in the resin results in even worse adhesion. Poor adhesion causes the number of rejects during processing to rise to unacceptably high levels as the PWB's literally break apart, rendering them useless.

There have also been efforts to produce laminates out of polyphenylene oxide/brominated epoxy resin (ppo/epoxy) blends. These are manufactured by dissolving both the ppo and epoxy resin in a mutual solvent. The resulting blend is used in the same fashion as a typical epoxy to produce a finished laminate. The Dk of such products is typically about 4.0 and the dielectric loss tangent is roughly one half that of straight epoxy (roughly 0.010). It is difficult to manufacture the product consistently, as the concentration of each component fluctuates from run to run. These fluctuations are due to viscosity and solubility variations which result in random domain sizes.

In the past, some work with highly filled systems employing microspheres was done. This is described in U.S. Pat. No. 5,126,192 which was granted Jun. 30, 1992 to Chellis et al. These systems use hollow microspheres in high volume percentages in order to obtain dielectric constants of less than 3.2. At such high loadings the microspheres stay dispersed very well when the prepreg is put under heat and pressure to make laminate. At the lower loadings, which are described in this invention, it is necessary to use flow modifiers such as hydrophobic fumed silica to keep the beads well dispersed. Uniform dispersion is required to maintain a position-independent dielectric constant throughout the board; a PWB whose dielectric constant is a function of position on the board will not work properly because the resulting signal speed will also be position-dependent. This will cause digital gates to be switched on and/or off at incorrect times. Also, if needed, pigment can be used to enhance the laminate aesthetically. Preferred pigments include $TiO_2$ and $Fe_2O_3$.

The use of the microspheres also has the added benefit of reducing the coefficient of thermal expansion (CTE). Because PWBs are composite materials, it is important to match as closely as possible the CTE of all materials in the composite so that thermal stresses, separation, cracking, etc. can be kept to a minimum. For example, the epoxy/E-glass laminate needs to approximate, in the x-, y- and z-directions, the CTE of the copper associated with the through holes. In the x- and y-directions the CTE is determined largely by the E-glass and little can be done to affect it. In the z-direction however, the CTE of most epoxy/glass laminates is much larger than the 17 ppm/C of copper. By dispersing glass microspheres into the matrix, z-axis expansion can be substantially reduced so that the laminates resulting CTE is much closer to the copper's CTE.

The goal of this invention is to provide prepreg and/or laminate that is UL 94 V-0 flame retardant, easily processable, has uniform low Dk, high Tg and relatively low CTE which more closely matches the CTE of copper, and therefore, minimizes through hole failure. This invention can be used with both passive and active components of PWB's.

These and other difficulties experienced with the prior art devices (chemical processes) have been obviated in a novel manner by the present invention.

It is, therefore, an outstanding object of the present invention to provide a printed circuit board prepreg with a dielectric constant reduced from the normal value into a range which results from partial loading of the prepreg with gas-filled spheres.

Another object of this invention is a printed circuit board prepreg with a substantially uniform dielectric constant reduced from the normal value into a range which results from partial loading of the prepreg with gas-filled spheres.

A further object of the present invention is a printed circuit board prepreg with a dielectric constant reduced from the normal value into a range which results from partial uniform loading of the prepreg with gas-filled spheres.

It is another object of the invention a printed circuit board prepreg formed of a composite laminate of reinforced hydrocarbon polymer resin with a partial, uniform loading of gas-filled spheres.

A still further object of the invention is a printed circuit board prepreg with a dielectric constant reduced from the normal value and which is fire-resistant.

It is a further object of the invention to a printed circuit board prepreg with a dielectric constant reduced from the normal value and which is structurally sound.

It is a further object of the invention to a printed circuit board prepreg with a dielectric constant reduced from the normal value and which is provides structurally sound plated through holes.

It is a further object of the invention to provide a printed circuit board prepreg with a dielectric constant reduced from the normal value and which can be manufactured simply and with highly reliable and consistent results.

With these and other objects in view, as will be apparent to those skilled in the art, the invention resides in the combination of pans set forth in the specification and covered by the claims appended hereto, it being understood that changes in the precise embodiment of the invention herein disclosed may be made within the scope of what is claimed without departing from the spirit of the invention.

SUMMARY OF THE INVENTION

This invention involves a prepreg composition and procedure for use in forming printed circuit boards with reduced and uniform dielectric constant, improved thermal expansion characteristics, and uniform appearance. The term "reduced dielectric constant" shall be used throughout this description to identify a dielectric constant that is lower than would have been the case in a product which is exactly the same, but without the hollow inorganic microsphere filler. As is described above, the dielectric constant of a prepreg or circuit board is very much dependent on their structure, composition, and method of manufacture.

The prepreg composite is a resin impregnated substrate and has a reduced dielectric constant as low as 3.5 and below. It contains 5–30% by resin volume of hollow inorganic microsphere filler whose diameters are less than 40 micrometers, and the uniform distribution of the hollow inorganic microspheres is controlled by the presence of hydrophobic fumed silica or other similar flow modifier.

The invention includes a filled prepreg composite having a reduced dielectric constant as low as 3.5, comprising 35–77% by prepreg weight of a resin selected from the group consisting of epoxy, cyanate ester, silicone, polyamide, and urethane; 5–30% by resin volume of hollow inorganic microsphere filler whose diameters are less than 40 micrometers; a coupling agent; 18–40% by prepreg weight of support material selected from the group consisting of aramid, electronics grade glass, quartz, paper and PTFE; 5–20% by volume of resin solids of inorganic flow modifier adapted to maintain uniform distribution of the hollow inorganic microspheres in the resin; and pigments. The hollow inorganic microspheres are uniformly distributed and display a compressive strength between 400 and 4,000 lbs./in$^2$. The distribution of the hollow inorganic microspheres is controlled by the addition of hydrophobic fumed silica or other flow modifier. The polymer resin, hydrophobic fumed silica, hollow inorganic microspheres, pigments, and support material comprise a flame retardant material.

The prepreg composite additionally consists of a UV blocking dye or resin to ensure the laminate is opaque to UV light. About 95% of the hollow inorganic microspheres are glass or silica walled and have diameters less than 40 micrometers. The hollow inorganic microspheres comprise 5–30% by volume of the resin solids. The prepreg composite additionally contains a substance which grants flame retardant to the material. The substance which grants flame retardance consists of a halogen compound. The substance which grants flame retardance consists of a brominated polyglycidal ether of hisphenol A. The polymer resin is an epoxy and the bromine comprises 15–23% by weight of said resin. The polymer resin is an epoxy resin and the microspheres are present in an amount between 5–30% by resin volume.

The invention also includes a printed circuit board comprising of prepreg material having a reduced dielectric constant of as low as 3.5 made up of 40–77% by weight of one or more of the following resin types: epoxy, cyanate ester, silicone, polyamide, and urethane; about 5–30% by resin volume hollow inorganic microsphere filler whose diameters are less than 40 micrometers; a coupling agent; 18–40% support material made up of aramid, quartz, electronics grade glass, or PTFE; 2–20% by volume of resin solids inorganic fillers including hydrophobic fumed silica; and pigments.

The invention also includes a method of making the prepreg material and the printed circuit board described above.

BRIEF DESCRIPTION OF THE DRAWINGS

The character of the invention, however, may best be understood by reference to one of its structural forms, as illustrated by the accompanying drawings, in which.

DESCRIPTION OF THE PREFERRED EMBODIMENT

Figure 1:
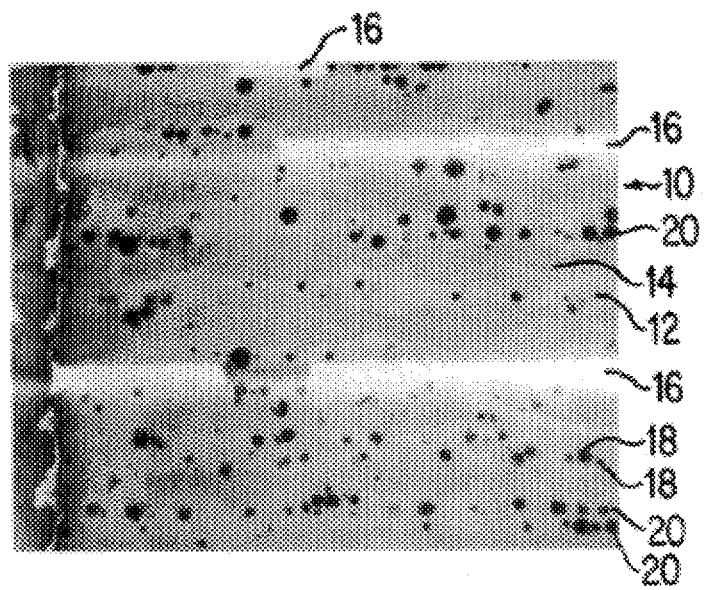
FIG. 1 is a 55×optical scope photograph depicting the cross-section of a multilayer PWB. Note that the copper innerlayers, resin matrix, E-glass, and glass microspheres are visible.

Referring first to FIG. 1, wherein are best shown the general features of a circuit board embodying the principles of the present invention, the circuit board, denominated generally by the numeral 10, is shown to include resin 12, substrate 14, conductive layers 16, and relatively uniformly distributed microspheres 18. The fumed silica 20 is not visible. More specifically, FIG. 1 is a 55×optical scope photograph depicting the cross-section of a multi-layer PWB. Note that the copper innerlayers, resin matrix, E-glass, and glass microspheres are visible.

Figure 2:
FIG. 2 is a more detailed (250×) optical scope photograph showing the same cross-section shown in FIG. 1.

FIG. 2 is a more detailed (250×) optical scope photograph showing the same cross-section shown in FIG. 1.

Figure 3:
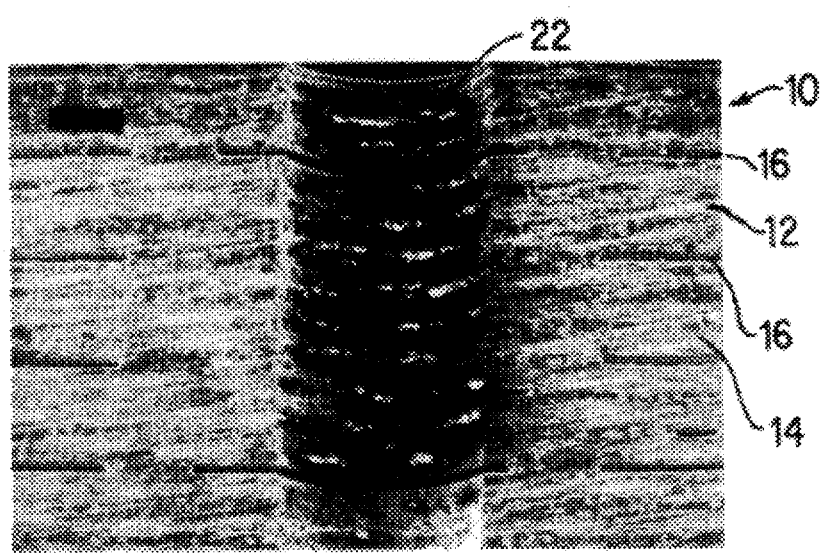
FIG. 3 is a 40×SEM photomicrograph detailing a cross-section of a through hole of a multi-layer laminate material consisting of the varnish given in formulation #1

FIG. 3 is a 40× SEM photomicrograph detailing a cross-section of a through hole 22 of a multi-layer laminate material consisting of the varnish given in formulation #1

Figure 4:
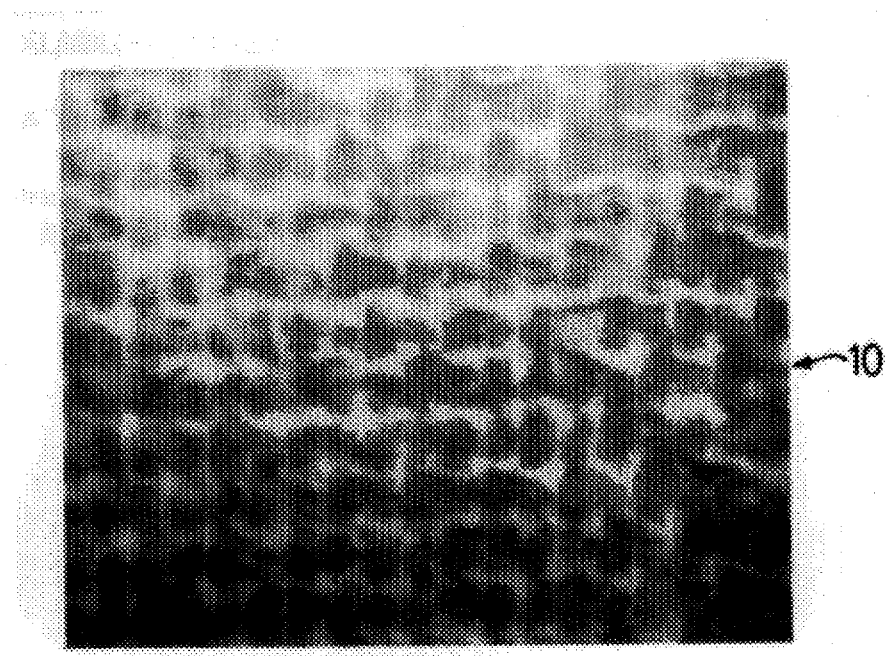
FIG. 4 is an optical scope photograph showing the laminate described in specific formulation #4 with non-uniformly dispersed microspheres.

FIG. 4 is an optical scope photograph showing the laminate described in specific formulation #4 with non-uniformly dispersed microspheres.

Figure 5:
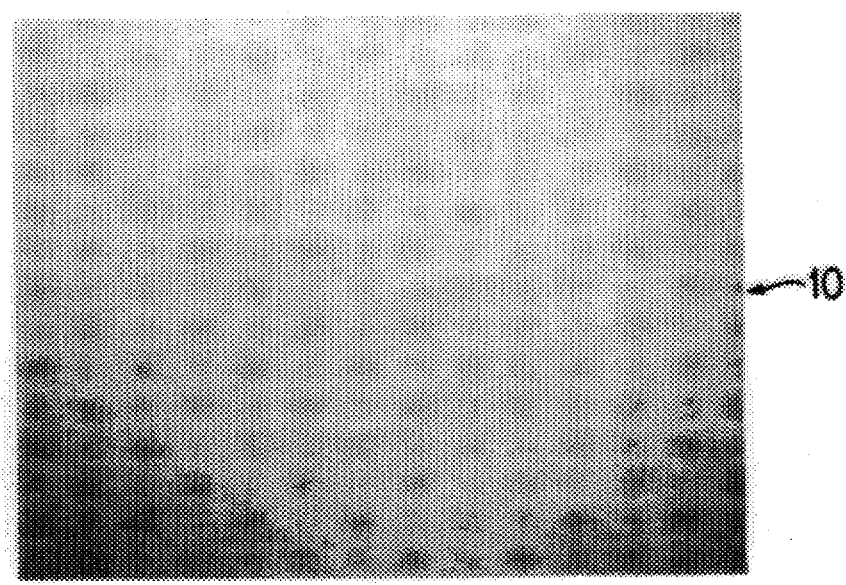
FIG. 5 is an optical scope photograph showing the laminate described in specific formulation #5 with uniformly dispersed microspheres.

FIG. 5 is an optical scope photograph showing the laminate described in specific formulation #5 with uniformly dispersed microspheres.

Figure 6:
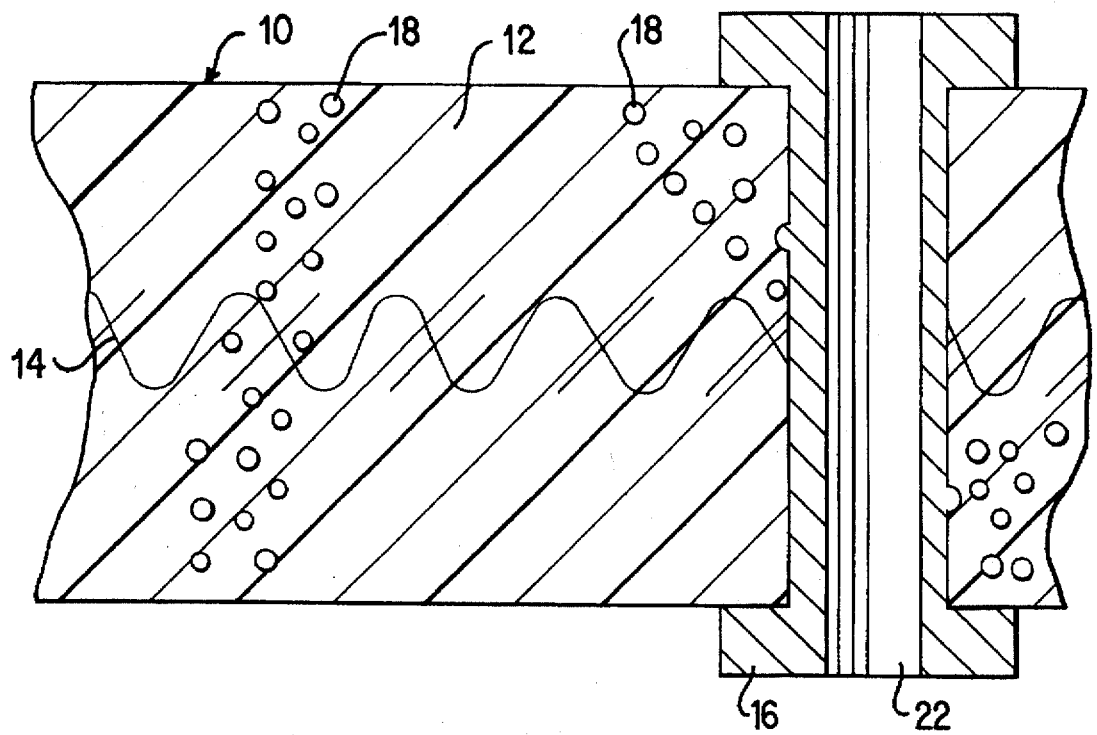
FIG. 6 is a diagrammatic cross-sectional view of a prior art circuit board in which the microspheres tend to agglomerate into nonuniform distributions.

FIG. 6 is a diagramatic cross-sectional view of a prior an circuit board in which the microspheres tend to agglomerate into nonuniform distributions. In this first mode of nonuniform distribution of the microspheres, the agglomeration is independent of the substrate and appears to result from transient pressure gradients in the process of applying the resin to the substrate.

Figure 7:
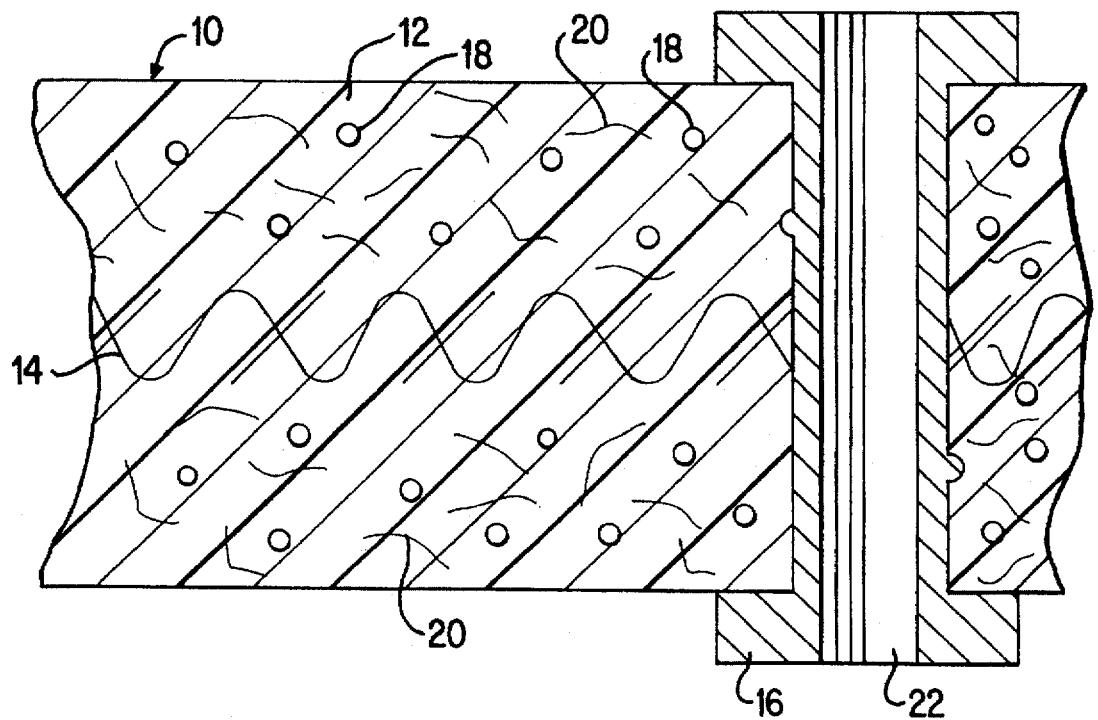
FIG. 7 is a diagrammatic cross-sectional view of a circuit board embodying the principles of the present invention and in which the microspheres tend to maintain a uniform distribution as a result of the fumed silica.

FIG. 7 is a diagramatic cross-sectional view of a circuit board embodying to principles of the present invention and in which the microspheres tend to maintain a uniform distribution as a result of the fumed silica.

Figure 8:
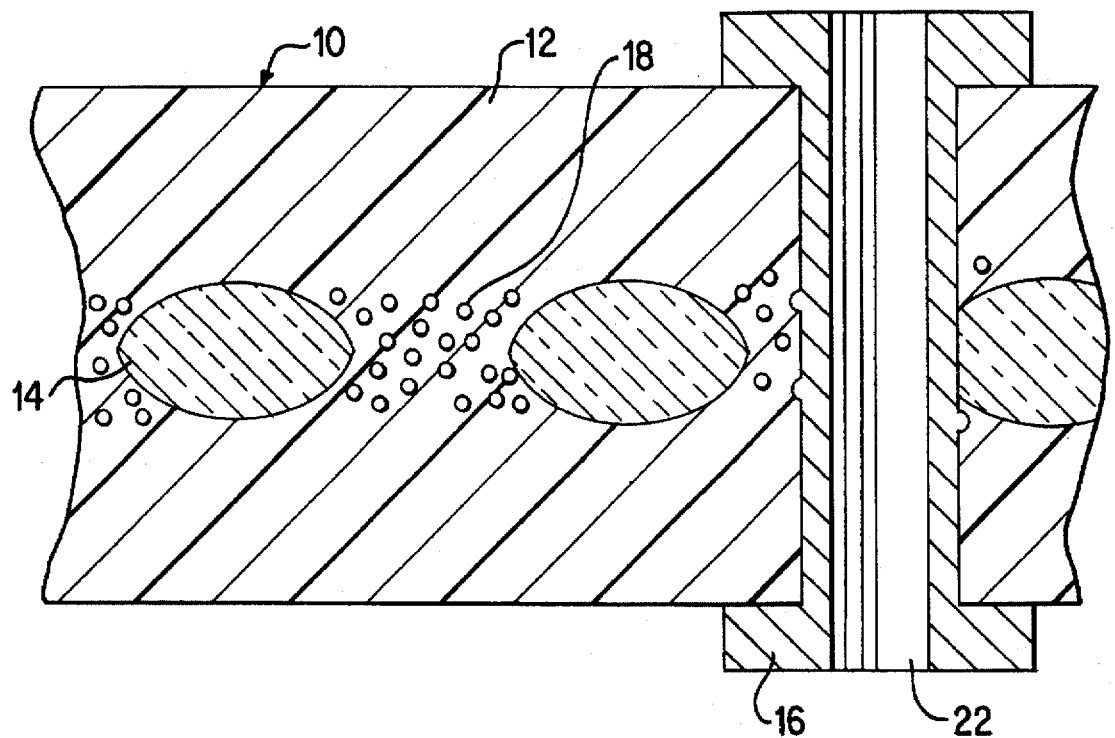
FIG. 8 is a diagrammatic cross-sectional view of a prior art circuit board in which the microspheres tend to agglomerate into nonuniform distributions particularly in the interstitial spaces within the woven substrate.

FIG. 8 is a diagramatic cross-sectional view of a prior art circuit board in which the microspheres tend to agglomerate into nonuniform distributions particularly in the interstitial spaces within the woven substrate. This second mode of nonuniform distribution of the microspheres causes the agglomeration which appears dependent on the geometry of the substrate and appears to result from transient pressure gradients which exist around the substrate during the process of applying the resin to the substrate.

Figure 9:
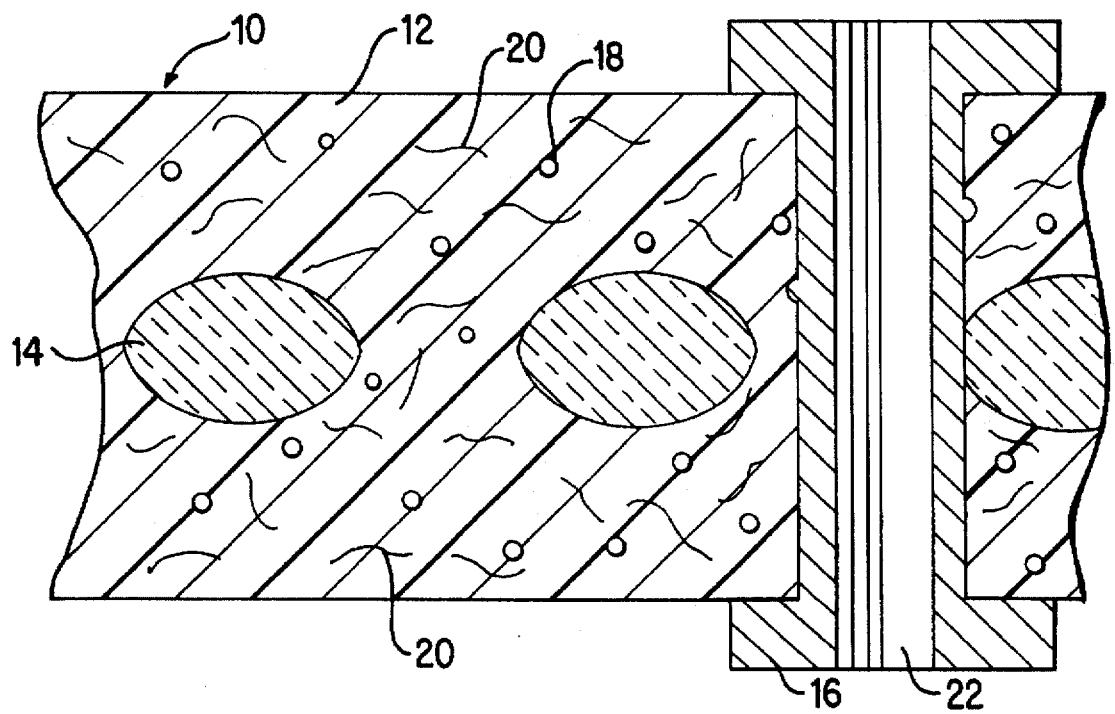
FIG. 9 is a diagrammatic cross-sectional view of a circuit board embodying to principles of the present invention and in which the microspheres tend to maintain a uniform distribution as a result of the fumed silica and particularly tends to avoid agglomeration and nonuniform distributions, particularly in the interstitial spaces within the woven substrate.

FIG. 9 is a diagramatic cross-sectional view of a circuit board embodying to principles of the present invention and in which the microspheres tend to maintain a uniform distribution as a result of the fumed silica and particularly tends to avoid agglomeration and nonuniform distributions, particularly in the interstitial spaces within the woven substrate.

In the past, some work with highly filled systems employing microspheres was done. This is described in U.S. Pat. No. 5,126,192 which was granted Jun. 30, 1992 to Chellis et at. These systems use hollow microspheres in high volumes percentages in order to obtain dielectric constants of less than 3.2. At such high loadings the microspheres were believed to stay dispersed very well when the prepreg is put under heat and pressure to make laminate. At the lower loadings, which are described in the present invention, it is necessary to use flow modifiers such as hydrophobic fumed silica to keep the beads well dispersed. In fact, it has been found that the high microsphere loadings (Dk less than 3.5 and 3.2) actually benefit from the flow modifiers of the present invention. Uniform dispersion is required to maintain a position-independent dielectric constant throughout the board; a PWB whose dielectric constant is a function of position on the board will not work properly because the resulting signal speed will also be position-dependent. This will cause digital gates to be switched on and/or off at incorrect times. Also, if needed, pigment can be used to enhance the laminate aesthetically. Preferred pigments include $TiO_2$ and $Fe_2O_3$.

The use of the microspheres also has the added benefit of reducing the coefficient of thermal expansion (CTE). Because PWBs are composite materials, it is important to match as closely as possible the CTE of all materials in the composite so that thermal stresses, separation, cracking, etc. can be kept to a minimum. For example, the epoxy/E-glass laminate needs to approximate, in the x-, y- and z-directions, the CTE of the copper associated with the through holes. In the x- and y-directions the CTE is determined largely by the E-glass and little can be done to affect it. In the z-direction however, the CTE of most epoxy/glass laminates is much larger than the 17 ppm/C of copper. By dispersing glass microspheres into the matrix, z-axis expansion can be substantially reduced so that the laminates resulting CTE is much closer to the copper's CTE.

The goal of this invention is to provide prepreg and/or laminate that is UL 94 V-0 flame retardant, easily processable, has uniform low Dk, high Tg and relatively low CTE which more closely matches the CTE of copper, and therefore, minimizes through hole failure. This invention can be used with both passive and active components of PWB's.

Prepreg is most often produced on treaters. The main components of a treater include feeder rollers, a resin impregnation tank, a treater oven, and receiver rollers. The reinforcing web (E-glass for example) is usually rolled into a large spool. The spool is then put on the feeder rollers which turn and slowly roll out the glass. The glass then moves through the resin impregnation tank, which contains the varnish. After emerging from the tank, the coated glass moves upward (at speeds ranging from 10–100 ft./min.) through the vertical treater oven at which is typically at 350 degrees F. At the base of the treater oven is a set of rollers, parallel to each other, that the glass passes between. The gap setting between the two rollers determines the amount of resin that will be coated onto the glass. In the treater, the varnish wets out the glass (the solvent in the varnish helps this process) and the solvent is boiled away. The resin begins to polymerize at this time. When the composite comes out of the tower it is cured enough so that the web is not wet or tacky. However, the cure process is stopped short of completion so that additional curing can occur when laminate is made. The web then rolls the prepreg onto the receiver rolls which can be changed when the run is finished. A new roll is then attached to the treater so that a new run can begin.

The invention can be produced with only minor adaptations to the existing equipment/methods of prepreg manufacture. The prepreg can be cut into sheets, sandwiched between two sheets of copper foil, subjected to heat (typically 350 degrees F.) and pressure (usually around 200 p.s.i.) in order to produce laminate. Copper lines providing electrical pathways can be etched on to the resulting laminate. These can be used as a single substrate or pressed with other sheets of laminate, copper, and prepreg to produce a multi-layer laminate. Surface mount devices can then be attached on the single or multi-layer laminate using through holes (drilled holes plated with copper) which are specifically made for that purpose.

The prepreg material consists of any combination of the following: thermoplastic or thermoset resins such as but not limited to epoxy, cyanate ester, silicone, polyamide, bismaleimide triazine, or urethane; impregnated with woven or non-woven E-glass, quartz, paper, aramid, PTFE or similar reinforcing material; 5– 10% by volume inert spacing and/or flow modifying material (for example hydrophobic fumed silica); wetting agents; thixotropy agents; 5–30% by resin volume microspheres; 1–5% by weight pigments such as $TiO_2$, $Fe_2O_3$ or other suitable coloring vehicle.

The idea to put hollow microspheres into prepreg and laminate is over 12 years old. The purpose of adding these spheres is to lower the overall Dk of said products by putting additional air/gas into them. Gas in general, and air in particular, have dielectric constants relatively close to the minimum of one, which is the Dk of a vacuum. The realization of these products has taken many years; the first successful application of such microspheres came in U.S. Pat. No. 5,126,192 by Chellis et al. in 1992. This patent covered only very high loadings of spheres, however, and did not work out the technical difficulties associated with 5–30% by resin volume additions to the prepreg.

One of the problems involved with using a much smaller percentage of microspheres is the lack of random distribution when the prepreg is pressed into laminate. This occurs because the glass beads tend to flow from high pressure areas to ones of low pressure when the prepreg is being pressed into laminate. Because the microspheres take up a relatively small volume of space throughout the laminate al almost all of the spheres congregate together in the interstitial space of the fiberglass (or other) weave. The weave acts as a well into which the beads fall, and an enormous amount of kinetic energy is required for them to climb out of the well (or alternatively, for a non-woven substrate the beads collect wherever the strands of the substrate intertwine). This problem is not observed for laminate of high microsphere volumes, such as described in Chellis's patent, because it was believed that the spheres are already packed so tightly, it would require an enormous amount of force in order to pack them more tightly. As a result, the spheres were believed to remain randomly distributed. This invention overcomes the above difficulty by adding inert spacing material and/or flow modifiers to the resin. These serve to keep the spheres from moving along pressure gradients and gathering at areas of low pressure when pressed.

The flow modifiers which are found most effective are hydrophobic, finely-divided silica, and most preferably fumed or pyrogenic silica, a finely divided filler-reinforcing material formed by reacting silicon tetrachloride in an atmosphere of oxygen and hydrogen. It is sold under the trademark CAB-O-SIL. Although the normal form of fumed silica has a surface which is rich in hydroxyl groups which make the surface hydrophilic, this invention employs an hydrophobic form the surface of which is treated with various silane compounds (polydimethysiloxane (CAB-O-SIL TS-720), dimethydichlorosilane (CAB-O-SIL TS-610), or hexamethydisilazane (CAB- O-SIL TS-530)) to render to silica surface non-polar (TS-720), or partially polar and partially nonpolar (TS-610). It is believed that the interaction of the hydrophobic silica surface with the resin, treated substrate, and treated microspheres is responsible for the uniform distribution of the microspheres in the resin. Finely divided silica can also be produced by acidification of sodium silicate solutions and by evaporation of alcoholic solutions of silicic acid.

Not all flow modifiers do an equally good job at inhibiting the microspheres from moving along these gradients. Some modifiers tried but deemed insufficient for this particular task include: the BYK-Chemie products Disperbyk 163, BYK-W995, BYK-W990, Anti-Terra U-100, and Anti-Terra U-226. Also tried were Monsanto's Modaflow, and 3M's Fluorad FC-430. Keeping the microspheres evenly distributed is important for two reasons: first and foremost is the fact that a uniform Dk is wanted throughout the laminate. This allows for position independent transmission speeds of electrical signals. The second reason is that uniform boards look better, and appearance is an important part of being accepted into the commercial marketplace.

Note that the hollow microspheres may be coated with an amino, methacryloxy or vinylsilane and/or other appropriate agent to improve the interfacial bond between the resin and the microballoon. If such an agent is used, the improved bond helps to increase the electrical strength of the product since there is no longer an easy path for the electrical current to exploit when traveling through the board. The greater bond strength also allows the spheres in the drill's path during through hole drilling to shatter rather than fall out of the matrix. This is preferable because when the holes are drilled, they are then plated with copper and the copper adheres better to the glass sphere than it does to the resin itself. This prevents outgassing (the release of gas which can build up as a result of processing between the copper and its substrate if the bond between them fails) and blistering (separation or swelling between the photoresist which is used to protect the copper that does not need to be chemically etched and the surface to which it is applied) of the through holes which can render a board useless.

The use of microspheres also has the added benefit of reducing the coefficient of thermal expansion. As most materials heat up, they expand. In the case of copper, the CTE is 17 ppm/C. For composite materials it is important to match as closely as possible the CTE of all materials comprising the composite so that thermal stresses, separation, cracking, etc. can be kept to a minimum. For example, PCB laminates need to approximate, in the x-, y-, and z- directions, the 17 ppm/C of copper to avoid the above problems. In the x- and y- directions the CTE is largely determined by the impregnated glass fibers. The z- direction CTE, however, tends to be much larger than the 17 ppm/C of copper. By employing glass microspheres in the matrix z-axis expansion can be substantially reduced so that it is much closer to the copper's.

The adhesion of copper to its substrate is called the peel strength; it is literally the amount of force/length required to peel copper off the laminate substrate. Normally, an epoxy used in the PWB industry will have a peel strength of about 9–10 lbs./in. The military also utilizes an after float peel test which requires that the laminate be dropped in solder at 550° F. for 10 seconds. The laminate is then tested for peel strength. After float peel strengths for conventional epoxies also tend to be about 9–10 lbs./in. This invention returns values similar to the typical epoxies.

PWB laminates should not absorb high levels of water or solvents, such as N-methylpyrrolidone (NMP), because of the damage these can cause to the Tg, dimensional stability, and other properties. This invention absorbs water and solvent at levels which tend to be less than or equal to the more common epoxy PWB laminates. This is a result of the fact that some of the composite's resin has been replaced by a relatively inert inorganic material which absorbs very little water or solvent.

EXAMPLES

Specific formulation #1

The following formulation and procedure were used to make a UL-94 V0 flame retardant laminate; the resulting laminate's Dk was 4.33, and the dissipation factor was 0.018. These numbers were achieved with a resin content of 38.58% by weight. The varnish consisted of 450 grams of D.E.T. epoxy resin (cured Diglycidal Ether of Tetrabromobisphenol A) (80% by weight resin in acetone), 27.9 grams of T.E.T. epoxy resin (cured Tetraglycidal Ether of Tetraphenyl Ethane) (70% by weight resin in acetone), 12.2 grams of dicyandiamide, 0.6 grams of 2-methylimidazole, 142 grams of dimethylformamide, 16.2 grams of 3M D-32 microspheres coated with A-187 epoxy silane, 15.9 grams of TS-610 Cab-O-Sil hydrophobic fumed silica, 12.0 grams of 58% by weight pigment Tint-Ayd futile $TiO_2$, and 3.0 grams of 48% by weight pigment Tinit-Ayd light lemon yellow oxide, and 7628 style E-glass cloth supplied by BGF with 642 silane finish. A target laminate thickness of 0.007 inches was sought. This was achieved by running the varnish covered glass through rollers approximately 0.007–0.008 inches apart. The glass was then brought to the B-stage by curing at 168° C. for two and a half minutes. A three ply laminate was made, with size one oz. copper on each side, by pressing the prepreg and copper in a book at 176° C. and 200 p.s.i for 90 minutes. The flammability was tested and found to pass the UL-94 V0 qualifications.

This activity resulted in a printed circuit board with reduced and uniform dielectric constant, improved thermal expansion characteristics, and uniform appearance

Specific formulation #2

A laminate of thickness 0.019 inches was made using Du Pont Thermount E220 aramid paper as the core material. The laminate has a 3.62 Dk and a dissipation factor of 0.021. The resin content was determined to be 91.86% by weight. The varnish consisted of 150 grams of Ciba-Geigy XB-4383-1 epoxy resin (80% by weight in methyl ethyl ketone), 9.3 grams of T.E.T. epoxy resin (70% by weight in acetone), dimethylformamide, 5.3 grams of TS-610 Cab-O-Sil hydrophobic fumed silica, 4.0 grams of Tint-Ayd rutile $TiO_2$ (58% by weight pigment), 1.0 grams of Tint-Ayd light lemon yellow oxide (48% by weight pigment). After coating the laminate with the varnish and pulling through rollers set at 0.008 inches apart, the glass was B-staged. This was done by partially curing the material for two and a half minutes at 168° C. One ply of prepreg with 1 oz. copper on each side was then pressed for 90 minutes at 250 p.s.i. and 176° C. When flammability testing was performed, the laminate passed the requirements for a UL-94 V0 rating.

This activity resulted in a printed circuit board with reduced and uniform dielectric constant, improved thermal expansion characteristics, and uniform appearance.

Specific formulation #3

A three ply UL-94 V0 7628 glass style laminate of thickness 0.021 inches was made using BGF brand glass with 642 epoxy silane finish. The resin content was determined to be 43.23% and the dielectric constant was 4.16; the dissipation factor was 0.016. The varnish was comprised of 280.3 grams of Ciba-Geigy XB-4383-1 (80% by weight in methyl ethyl ketone), 36.8 grams of T.E.T. epoxy resin (70% by weight in acetone), 87.8 grams of dimethylformamide, 7 grams of dicyandiamide, 0.15 grams 2-methylimidazole, 13.9 grams of Emerson and Cuming's brand SDT-40 Eccospheres coated with Dow Z-6040 epoxy silane, 21.0 grams of TS-610 Cab-O-Sil hydrophobic fumed silica, 16.0 grams of 58% by weight pigment Tint-Ayd ruffle $TiO_2$, and 3.0 grams of 48% by weight pigment Tint-Ayd light lemon yellow oxide. The 0.021 inch thickness of the laminate was obtained by setting the roller gap at 0.008 inches. The glass was then B-staged by curing at 168° C. for two and a half minutes. Three piles of glass were used with one ply of one oz. copper on each side. The press cycle was 200 p.s.i. for 90 minutes at 176° C.

This activity resulted in a printed circuit board with reduced and uniform dielectric constant, improved thermal expansion characteristics, and uniform appearance.

Specific formulation #4

A laminate was produced with 15% by volume 3M D-32 glass bubbles. The formulation used did not employ Cab-O-Sil and as a result the laminate looked uneven in its distribution of glass bubbles. The formula used was the following: 150 grams of D.E.T. epoxy resin, 8.4 grams of T.E.T. epoxy resin, 3.93 grams of dicyandiamide, 0.15 grams of 2-methylimidazole, 5.4 grams of D-32 microspheres, and 0.68 grams of DisperByk Byk-163 flow modifier. The resulting laminate was made with 3 plys of BGE 7628 glass and was 0.021 inches thick. Because of the uneven appearance, the laminate was tested on the edge and in the middle for dielectric constant. The result was that the middle has a Dk of 4.5 while the edge had a Dk of 5.0. The disparity was due to the fact that the microspheres were unevenly distributed. This was caused by the inability of the flow modifier to prevent the microspheres from moving from high to low pressure areas during the pressing process.

Specific formulation #5

A laminate was made with a formulation similar to the one given in specific formulation number 4. The glass used was style 7628 and a three ply 0.021 inches thick laminate was pressed with the following formula: 150 grams of D.E.T. epoxy resin, 8.4 grams of D.E.T. epoxy resin, 3.93 grams of dicyandiamide, 0.12 grams of 2-methlimidazole, 5.4 grams of D-32 microspheres, 5.3 grams of TS-610 Cab-O-Sil. The press cycle was 90 minutes at 350 degrees F. and 200 p.s.i. of pressure; this was identical to the one used in specific formulation number 4. This laminate had a very even appearance, and the dielectric constant on the edge was 5.0, while the center had an identical 5.0 dielectric constant.

Specific formulation #6

A laminate of thickness 0.012 inches was made with BGF 2313 E-glass. The laminate had a resin content of 26.49%, a dielectric constant of 3.68, and a loss tangent which was not measurable with the instrumentation at hand. The measurement gave a negative dissipation factor when measured with a QuadTech 1 MHz LC Digibridge model 1687-B. (Since this is impossible due to the principle of conservation of energy, it must be concluded that the dissipation is so near zero that it is not measurable with the given equipment.) The varnish consisted of 203.5 grams of Ciba-Geigy Rex-379 (75% solids in methyl ethyl ketone), 54.2 grams of Great Lakes CN-1427 flame retardant, 48.7 grams of propylene glycol methyl ether acetate, 93.5 grams of methyl ethyl ketone, 0.27 grams of manganese octoate (6% solution), 25 grams of 3M D-32 microspheres and 23 grams of TS-720 Cab-O-Sil. The resulting prepreg was made by pressing the laminate at 100 p.s.i. for 90 minutes and a temperature of 350 degrees F. This was followed by a post bake for one hour at 180 degrees Celsius in order to fully cure the laminate.

This activity resulted in a printed circuit board with reduced and uniform dielectric constant, improved thermal expansion characteristics, and uniform appearance.

Specific formulation #7

The following laboratory-scale procedure was found useful for producing a product embodying the present invention.

1. 150 gms. D.E.T. epoxy resin added to beaker
2. 9.4 gms. T.E.T. epoxy resin added to beaker
3. add 16 gms. 25% dicy (dicyandiamide)/75% DMF (dimethylformamide)
4. add 2.0 gms. 10% 2-MI (2-methylimidazole)/90% DMF added
5. 33.4 gms. DMF added
6. 4.0 gms. Titanium dioxide into beaker
7. 1 gm. lt. lemon yellow oxide into container
8. 5.4 grams microspheres added
9. Put batch under mixer and mix using low shear
10. Added 5.3 grams of CAB-O-Sil fumed silica to beaker while beaker's contents were still mixing as above
11. Added DMF while mixing until viscosity is roughly 45 seconds with #2 Zahn cup (approx. 115 centiPoise)
12. Let mixer run for 1–4 hours
13. Take mixture and paint, with paintbrush, the varnish onto glass
14. Pull glass through rollers with gap specifically set at a given distance
15. Hang in oven at 168 degrees C. for two and a half minutes
16. Sandwich between two sheets of copper and press at 176 degrees C. for 90 minutes
17. Three hours at 168 degrees C. postbake This activity resulted in a printed circuit board with reduced and uniform dielectric constant, improved thermal expansion characteristics, and uniform appearance.

Specific formulation #8

The following treater-scale procedure was found useful for producing a product embodying the present invention.

1. Added 60% PM (propylene glycol methyl ether acetate) /40% DMF to drum
2. Put in dicy and turned on mixer
3. Added D.E.T. epoxy resin when dicy was in solution
4. Added T.E.T. epoxy resin
5. Put in titanium dioxide pigment
6. Put in light lemon yellow oxide pigment
7. Put in microspheres. Let mix until uniform then added
8. Cab-O-Sil fumed silica (mixer has been running since step 2)
9. Let mix until uniform
10. Added 2-MI, mix becomes uniform & mixer is shut off
11. Pump into dip tank, adjust viscosity with solvents given above until 45 second on #2 Zahn cup is reached
12. Treat glass to produce prepreg This activity resulted in a printed circuit board with reduced and uniform dielectric constant, improved thermal expansion characteristics, and uniform appearance.

Specific formulation #9

The second treater-scale procedure yielded successful results.

1. Added 60% PM/40% DMF
2. Put in microspheres and turned on mixer
3. Added Cab-O-Sil fumed silica
4. Added dicy
5. Added D.E.T. epoxy resin
6. T.E.T. epoxy resin put in
7. Titanium dioxide added
8. Light lemon yellow oxide added
9. 2-MI put in. (The mixer has been running continuously since step 2)
10. Mix becomes uniform and mixer is shut off
11. Pump into dip tank and test viscosity. Adjust with solv. as before.
12. Treat glass to make prepreg
13. Sandwich between copper and press to produce laminate.

This procedure proves that order of the steps is not critical in producing good looking prepreg. The contents can be added in any order as long as everything is mixed well.

This activity resulted in a printed circuit board with reduced and uniform dielectric constant, improved thermal expansion characteristics, and uniform It is obvious that minor changes may be made in the form and construction of appearance. the invention without departing from the material spirit thereof. It is not, however, desired to confine the invention to the exact form herein shown and described, but it is desired to include all such as properly come within the scope claimed.

The invention having been thus described, what is claimed as new and desire to secure by Letters Patent is:

1. A filled prepreg composite having a uniform reduced dielectric constant comprising:
   (a) resin;
   (b) 5–30% by volume of resin solids of hollow inorganic microsphere filler;
   (c) support material; and
   (d) sufficient hydrophobic, finely divided silica flow modifier to produce and maintain uniform distribution of the hollow inorganic microspheres in the resin.

2. A prepreg composite as recited in claim 1, wherein the resin includes 2–20% by volume of resin of the hydrophobic, finely divided silica.

3. A prepreg composite as recited in claim 1, wherein the flow modifier is hydrophobic fumed silica.

4. A prepreg composite as recited in claim 1, wherein the finely divided silica has been rendered hydrophobic by treatment with a silane compound chosen from the group consisting of: polydimethy-siloxane, dimethyl dichlorosilane, and hexamethydisilazane.

5. A prepreg composite as recited in claim 1, wherein about 95% of the hollow inorganic microspheres are glass- or silica-walled and have diameters less than 40 micrometers.

6. A prepreg composite as recited in claim 1, wherein the hollow inorganic micospheres display a compressive strength between 400 and 4,000 lbs. /in$^2$.

7. A prepreg composite as recited in claim 1, further comprising a coupling agent.

8. A prepreg composite as recited in claim 7, wherein the coupling agent is chosen from the group consisting of: amino-, methacyloxy- and vinyl-silane.

9. A prepreg composite as recited in claim 1, additionally containing a substance which grants flame retardance to the material.

10. A prepreg composite as recited in claim 9, wherein the substance which grants flame retardant consists of a halogen compound.

11. A prepreg composite as recited in claim 10, wherein the substance which grants flame retardance consists of a brominated polyglycidal ether of bisphenol A.

12. A prepreg composite as recited in claim 11, wherein the resin is an epoxy and the bromine comprises 15–23% by weight of said resin.

13. A prepreg composite as recited in claim 1, additionally consisting of a UV blocking dye to ensure the composite is opaque to UV light.

14. A prepreg composite as recited in claim 1, further comprising pigments.

15. A prepreg composite as recited in claim 14, wherein the resin, hydrophobic finely divided silica, hollow inorganic microspheres, pigments, and support material comprise a flame retardant material.

16. A prepreg composite as recited in claim 1, wherein said resin is selected from the group consisting of epoxy, cyanate ester, silicone, polyamide, bismaleimide triazine, and urethane.

17. A prepreg composite as recited in claim 1, wherein said support material is selected from the group consisting of aramid, electronics grade glass, quartz, paper and PTFE.

18. A conductor-clad substrate made from the composite of claims 1, 2, 3, 4, 5, 6, 7, 8, 9, 10, 11, 12, 13, 14, 15, 16 and 17.

19. A printed circuit board made from the composite of claims 1, 2, 3, 4, 5, 6, 7, 8, 9, 10, 11, 12, 13, 14, 15, 16 or 17.

20. A filled prepreg composite having a uniform, reduced dielectric constant, comprising:

(a) resin;

(b) 5–30% by volume of resin solids of hollow inorganic microsphere filler;

(c) support material; and (d) means to produce and maintain uniform distribution of the hollow inorganic microspheres in the resin.

* * * * *